United States Patent [19]

Schmalzl

[11] Patent Number: 4,640,979
[45] Date of Patent: Feb. 3, 1987

[54] RADIO-FREQUENCY-TIGHT SHIELD WITH PLANAR PARTS

[75] Inventor: Dieter Schmalzl, Munich, Fed. Rep. of Germany

[73] Assignee: Siemens Aktiengesellschaft, Berlin and Munich, Fed. Rep. of Germany

[21] Appl. No.: 630,194

[22] Filed: Jul. 12, 1984

[30] Foreign Application Priority Data

Aug. 5, 1983 [DE] Fed. Rep. of Germany ....... 3328386

[51] Int. Cl.$^4$ .............................................. H05K 9/00
[52] U.S. Cl. .................................. 174/35 GC; 361/424
[58] Field of Search .......... 174/35 GC, 35 R, 35 MS,
174/51; 219/10.55 D; 361/424; 455/300, 301;
411/460, 475

[56] References Cited

U.S. PATENT DOCUMENTS 2,042,982  6/1936  Chaney ........................... 411/475 X
3,277,230 10/1966  Stickney et al. ................ 174/35 GC
3,504,095  3/1970  Roberson et al. ............. 174/35 GC Primary Examiner—A. T. Grimley
Assistant Examiner—D. A. Tone
Attorney, Agent, or Firm—Hill, Van Santen, Steadman & Simpson

[57] ABSTRACT

An RF shield of electronic devices for example, a covering for electrical equipment which includes frame and panel structures having planar parts characterized by a spring element being assembled on the planar part to insure contact between the part and another part. The spring element has a pair of end portions connected by a center portion which has a convex configuration and the end portions have hook-like portions for securing the spring to the planar part by being inserted in a pair of spaced apertures or for engaging an edge of the part and an edge of an aperture. The hook end portion can extend in the same direction and one portion can include a 180° bend to lock the spring on the part. The convex center portion can be a smooth convex curve or it can be a sharp triangular-shaped bend.

6 Claims, 4 Drawing Figures

RADIO-FREQUENCY-TIGHT SHIELD WITH PLANAR PARTS

BACKGROUND OF THE INVENTION

The present invention is directed to a radio-frequency-tight shield of electronic devices, particularly electronic devices of the data industry, which shield utilizes a frame and panel construction having planar parts or surfaces.

SUMMARY OF THE INVENTION

The object of the invention is to create an easily interchangeable contact part for the frame and sheet parts of a radio-frequency proof shielding or shield for an electronic device.

In order to achieve this object, the present invention is directed to an improvement for a radio-frequency-tight shielding of an electronic part, said shielding including frame and sheet metal parts having planar surfaces or parts. The improvement comprises one of the planar parts having at least one spring element secured thereon, each of said spring elements has a center portion with a convex or curved configuration extending between a pair of bent hook-like end portions, the hook-like end portions engaging edges of the one planar part which are formed either by an edge of the part and an aperture or by the pair of spaced apertures so that in a relaxed condition, the edges coact to prevent the spring from falling out of the planar part or being disassembled therefrom.

The bent end portions of the spring can have at least two bends and have a Z shape and be axially symmetrical and extend in opposite directions. In another embodiment, the end portions have at least two bends with one portion having a Z shape and are isodirectional with obliquely downwardly proceeding ends or tabs.

In a still further embodiment, the end portion of one end is passed around an edge of the part or is passed through and around an edge of an aperture in the part and is bent through 180° to extend past the arcuate center portion to prevent the spring from becoming disconnected from the part. In this embodiment, the center section has approximately a triangular or V-shaped configuration.

In another embodiment, one end portion has a leg connected by a 180° bend to the center portion. The leg extends in the same direction as the other end portion and terminates in a hook to engage an edge of the aperture through which the other end portion extends. Thus, in this embodiment, the ends are isodirectional and proceed parallel to the inside of the planar part.

As a result of these measures, one obtains a single metal spring that can be snapped onto a panel or planar part. The metal spring will anchor and fix itself in a perforation by means of a lock-in due to its shape, encountering an over-elongation seat at the panel surface and being largely insensitive. The seating both in the facing as well as at the device forms a fixed contact. The spring is easy to incorporate or, respectively, replace, and is therefore provided in the appliance for assembly facilitation. It permits a great tolerance compensation and can also be applied to thin facings because it only dips slightly into the facing despite the large spring excursion.

Only one shaped hole is required for fastening the spring on the part and this hole can be fabricated with hardly any additional cost given the general perforation of the panel parts. This shaped hole can be provided around the facing during manufacture and so the fitting with a larger or smaller number of springs can be obtained depending upon the requirements of the built-in electronics. When the material around the shaped hole has been offset by a stamping or embossing such as disclosed in the copending U.S. Ser. No. 630,191 which issued as U.S. Pat. No. 4,554,400, then the shielding effect can be increased as a result of the slight distance between the facing and the frame since the spring clip can be deflected flush into the surface of the part.

DESCRIPTION OF THE PREFERRED EMBODIMENTS

Figure 1:
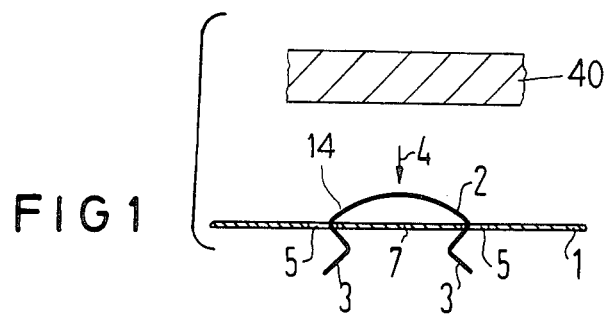
FIG. 1 is a cross-sectional view with portions in elevation of an embodiment of a spring in accordance with the present invention.

The principles of the present invention are particularly useful when incorporated in a spring 2 for use with a panel or part 1 having a planar portion or surface. The spring 2 has a center portion 14 which is connected to a pair of end portions 3. As illustrated, the center portion 14 has a convex configuration which curves away from a web 7 which extends between the apertures 5. The end portions 3 have a Z shape formed by a pair of bends and are inserted into a pair of spaced apertures 5 in the member or part 1. In the relaxed condition as illustrated, the spring 2 has its ends 3 hooked into the apertures 5 and thus is retained against falling out. When assembling the planar part or member 1 to a frame member 40, the convexity of the portion 14 can be pressed flat against the web 7 by a pressure in the direction of arrow 4. A contact pressure thus will occur between the planar part 1 and the member 40 to which it is being joined. The two Z-shaped end portions 3 still maintain hooked within the part 1 and maintain a stable position for the spring. As illustrated, the Z-shaped end portions 3 are mirror images of each other and are symmetrical to each other about the axis of the spring 2.

Figure 2:
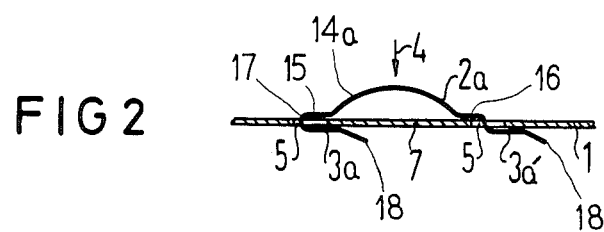
FIG. 2 is a cross-sectional view with portions in elevation of a second embodiment of the spring in accordance with the present invention.

Another or second embodiment of the spring is illustrated by the spring 2a in FIG. 2. The spring 2a has a convex portion 14a similar in shape to the portion 14 of the embodiment of FIG. 1. The convex portion 14a has two short outwardly extending legs 15 and 16 with the leg 15 being connected to an end portion 3a and the leg 16 being connected to an end portion 3a'. Both the end portions 3a and 3a' have an obliquely extending portion or tab 18 and both the portions 3a and 3a' extend in the same direction. The leg 15 and the end portion 3a form a 180° bend 17 whereas the leg 16 and the end portion 3a' form a Z-shaped bend.

The spring 2a is secured in the part 1 by having the end portion 3a' inserted through the aperture 5 as the end portion 3a is being inserted through the adjacent aperture 5. As illustrated, the end portions 3a and 3a' engage one side of the plate or part 1 as the center portion 14a engages the opposite side. It will be noted that when a force is applied in the direction of the arrow 4 the center portion 14a will be moved flat to engage the web 7 extending between the two openings or apertures 5.

Figure 3:
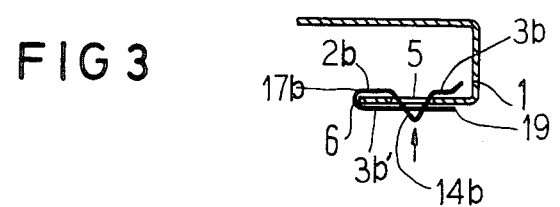
FIG. 3 is a cross-sectional view with portions in elevation of a third embodiment of a spring in accordance with the present invention.

A third embodiment of a spring in accordance with the present invention is illustrated at 2b in FIG. 3. The spring 2b has a contact center portion 14b which is illustrated as a V-shaped configuration, that extends through an aperture such as 5 in the planar part 1. The contact portion 14b is disposed between end portions 3b and 3b'. As illustrated, the end portion 3b has a short oblique portion and the end portion 3b' has a 180° bend 17b with an elongated leg 19 which extends back past the contact portion 14b. As illustrated, the spring 2b has the end portion 3b' wrapped around an edge 6 of the planar part 1. However, it can be wrapped around an edge of an aperture similar to 5. It is noted that the leg 19 coacts with the contact portion 14b to prevent the spring from accidentally being removed from the part 1.

Figure 4:
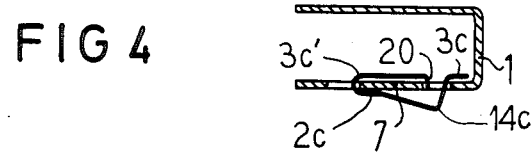
FIG. 4 is a cross-sectional view of a fourth embodiment of a spring which is similar to the embodiment of FIG. 2.

Another or fourth embodiment is a spring 2c which is illustrated in FIG. 4. In this embodiment, a contact portion 14c has a V shape and has end portions 3c and 3c'. As illustrated, the end portion 3c' and 3c both extend in the same direction as in the embodiment of the spring 2a of FIG. 2. It is noted that the portion 3c' forms a 180° bend with the adjacent portion of the contact portion 14c. In addition, the end portion 3c' ends in a tab 20 which engages an edge of an aperture through which the end portion 3c extends so that the end portion 3c' engages the web lying between the two apertures or an edge and an aperture.

All of these springs may be manufactured of spring wire or ribbon.

Although various minor modifications may be suggested by those versed in the art, it should be understood that I wish to embody within the scope of the patent granted hereon, all such modifications as reasonably and properly come within the scope of my contribution to the art.

I claim:

1. In a radio-frequency-tight shield for electronic devices, said shield including a frame and panel structure with planar parts, the improvement comprising one of the planar parts having at least one spring element being assembled thereon, said spring element having a center contact portion extending between two end portions, said end portions being bent to form hook-shaped sections for engaging spaced edges formed on the one planar part, said spring being assembled on the one planar part with the center contact portion extending beyond a surface of the one planar part and the hook-shaped sections of the end portions engaging said edges and forming detents to prevent the spring element from becoming removed from the one planar part.

2. In a radio-frequency-tight shield according to claim 1, wherein said spaced edges of the one planar part are formed by spaced apertures in the one planar part, the center contact portion has a convex configuration and each of the hook-shaped sections of the end portions has a Z-shape which sections are axially symmetrical and are inserted into the shaped apertures.

3. In a radio-frequency-tight shield according to claim 1, wherein the spaced edges of the one planar part are formed by spaced apertures in the one planar part, the end sections being inserted into the apertures, the center contact portion has a convex configuration and one of said end sections has a Z shape and the other of the end sections has a reversed bend, said end sections are isodirectionally oriented and have an obliquely extending ends.

4. In a radio-frequency-tight shield according to claim 1, wherein one of the end portions has a reverse bend of 180° so that a leg of the one end portion extends alongside the center contact portion to prevent disengagement of the spring from the planar part.

5. In a radio-frequency-tight shield according to claim 1, wherein said spaced edges are formed by spaced apertures in the one planar part, said end portions extend through the apertures to engage said edges, one of the end portions having a reversed bend so both of the end portions extend isodirectionally and extend parallel to a surface of the one planar part with the one end portion having a tab bent to engage an edge of the aperture of the one planar part through which the other end portion extends.

6. A spring element for use in a radio-frequency shield comprising a center contact portion extending between two end portions, one of the two end portions having three bends to form a Z-shaped hook section terminating in an end tab, the other of the two end portions having a reversed bend with a leg terminating in an end tab, said leg and Z-shaped hook section being isodirectionally oriented with the end tabs extending obliquely thereto and said contact center portion being curved outwardly away from a plane formed by said end portions.

* * * * *